(12) United States Patent
Naveh et al.

(10) Patent No.: US 12,248,020 B2
(45) Date of Patent: Mar. 11, 2025

(54) DETECTING A FUNCTION SECTION IN A REPRESENTATION OF A QUANTUM CIRCUIT

(71) Applicant: Classiq Technologies LTD., Tel Aviv (IL)

(72) Inventors: Amir Naveh, Haifa (IL); Shmuel Ur, Shorashim (IL); Eyal Cornfeld, Ramat Gan (IL); Ofek Kirzner, Haifa (IL); Nir Minerbi, Haifa (IL)

(73) Assignee: CLASSIQ TECHNOLOGIES LTD., Tel Aviv (IL)

( * ) Notice: Subject to any disclaimer, the term of this patent is extended or adjusted under 35 U.S.C. 154(b) by 324 days.

(21) Appl. No.: 17/817,397

(22) Filed: Aug. 4, 2022

(65) Prior Publication Data
US 2024/0044973 A1   Feb. 8, 2024

(51) Int. Cl.
*G01R 31/317* (2006.01)
*G06N 10/40* (2022.01)

(52) U.S. Cl.
CPC ....... *G01R 31/31702* (2013.01); *G06N 10/40* (2022.01)

(58) Field of Classification Search
None
See application file for complete search history.

(56) References Cited

U.S. PATENT DOCUMENTS

| 11,281,988 | B1 | 3/2022 | Naveh | |
|---|---|---|---|---|
| 11,288,589 | B1 | 3/2022 | Naveh | |
| 11,294,797 | B1 | 4/2022 | Naveh | |
| 11,373,114 | B1 * | 6/2022 | Naveh | G06N 10/00 |
| 2021/0304054 | A1 * | 9/2021 | Neill | G06F 15/16 |
| 2022/0222559 | A1 | 7/2022 | Naveh | |
| 2022/0405626 | A1 * | 12/2022 | Naveh | G06N 10/00 |

* cited by examiner

*Primary Examiner* — Jermele M Hollington
*Assistant Examiner* — Carl F. R. Tchatchouang

(57) ABSTRACT

A method, apparatus, and product comprising: obtaining a representation of a quantum circuit; determining that a qubit is a candidate auxiliary qubit by estimating that a state of the qubit at a first cycle is identical to a state of the qubit at a second cycle; identifying a function section in the quantum circuit based on the qubit, the function section commencing at a beginning cycle, the beginning cycle is ordered before the second cycle, the function section ending at an ending cycle, the ending cycle is ordered after the first cycle, the ending cycle is ordered after the commencing cycle, the function section utilizing the qubit as an auxiliary qubit; and outputting an indication of the function section.

26 Claims, 8 Drawing Sheets

DETECTING A FUNCTION SECTION IN A REPRESENTATION OF A QUANTUM CIRCUIT

TECHNICAL FIELD

The present disclosure relates to quantum computing in general, and to detecting at least one function section in a representation of a quantum circuit, in particular.

BACKGROUND

Quantum computing is a computational paradigm that is fundamentally different from classic computing. In contrast to classic computing, which utilizes bits, quantum computing utilizes qubits. The qubits have unique features, as each qubit can be in superposition, several qubits can be entangled, and all operations on qubits besides measurement, referred to as quantum gates, must be reversible. Temporarily computed values are stored on additional helper qubits, referred to as auxiliary qubits.

BRIEF SUMMARY

One exemplary embodiment of the disclosed subject matter is a method comprising: obtaining a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit; determining that the qubit is a candidate auxiliary qubit, wherein said determining comprises estimating that a state of the qubit at the first cycle is identical to a state of the qubit at the second cycle; identifying a function section in the quantum circuit based on the qubit, the function section commencing at a beginning cycle, the beginning cycle is ordered before the second cycle, the function section ending at an ending cycle, the ending cycle is ordered after the first cycle, the ending cycle is ordered after the commencing cycle, the function section utilizing the qubit as an auxiliary qubit; and outputting an indication of the function section.

Optionally, said identifying the function section comprises performing a forward light-cone analysis of the qubit from the first cycle and a backward light-cone analysis of the qubit from the second cycle, the function section comprising an intersection between the forward light-cone analysis and the backward light-cone analysis.

Optionally, said identifying the function section comprises: iteratively searching for a next candidate auxiliary qubit that is associated with the intersection, the next candidate auxiliary qubit is characterized in being estimated to have a same value at a third cycle and at a fourth cycle, the fourth cycle is ordered after the third cycle, wherein at least one cycle between the third and fourth cycles is included in the intersection; and performing a forward light-cone analysis of the next candidate auxiliary qubit from the third cycle and a backward light-cone analysis of the next candidate qubit from the fourth cycle, whereby identifying a second intersection, the function section comprising the second intersection.

Optionally, said identifying the function section comprises iteratively performing, starting with the qubit, a forward light-cone analysis of one or more qubits or gates included in the first cycle and a backward light-cone analysis of one or more qubits or gates included in the second cycle, until no additional qubits or gates are identified in an intersection of the forward light-cone analysis and the backward light-cone analysis, the function section comprising one or more qubits or gates identified in the intersection.

Optionally, said determining that the qubit is the candidate auxiliary qubit is based on a state inspection stage, the state inspection stage comprises inspecting states of one or more qubits of the plurality of qubits at each cycle of the plurality of cycles, wherein a qubit of the one or more qubits comprises an individual qubit or a quantum register.

Optionally, the method further comprises verifying that the qubit is the auxiliary qubit using a testing circuit, the testing circuit is synthesized based on the quantum circuit and is configured to verify or refute that the qubit has an auxiliary property.

Optionally, the quantum circuit is an outcome of a preprocessing step, the preprocessing step configured to: detect in an initial quantum circuit one or more patterns of at least one of: a swap operation and an identity operation; and remove the one or more patterns from the initial quantum circuit.

Optionally, the quantum circuit is an outcome of a preprocessing step, the preprocessing step configured to: detect in an initial quantum circuit one or more patterns of gate-level implementations of one or more multi-qubit gates; and replace the one or more patterns of the gate-level implementations of the one or more multi-qubit gates with the one or more multi-qubit gates.

Optionally, the first and second cycles are not adjacent cycles, wherein at least one intermediate cycle separates the first and second cycles, wherein a state of the qubit at the at least one intermediate cycle is different from the state of the qubit at the first cycle.

Optionally, the quantum circuit is a circuit being reverse engineered without having access to a quantum program from which the quantum circuit was synthesized.

Optionally, said estimating comprising estimating that the state of the qubit at the first cycle is identical to the state of the qubit at the second cycle with a confidence score that is greater than a threshold.

Another exemplary embodiment of the disclosed subject matter is an apparatus comprising a processor and coupled memory, said processor being adapted to: obtain a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit; determine that the qubit is a candidate auxiliary qubit, wherein said determining comprises estimating that a state of the qubit at the first cycle is identical to a state of the qubit at the second cycle; identify a function section in the quantum circuit based on the qubit, the function section commencing at a beginning cycle, the beginning cycle is ordered before the second cycle, the function section ending at an ending cycle, the ending cycle is ordered after the first cycle, the ending cycle is ordered after the commencing cycle, the function section utilizing the qubit as an auxiliary qubit; and output an indication of the function section.

Yet another exemplary embodiment of the disclosed subject matter is a system comprising a processor and coupled memory, said processor being adapted to: obtain a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit; determine that the qubit is a candidate auxiliary qubit, wherein said determining comprises estimating that a state of the qubit at the first cycle is identical to a state of the qubit at the second cycle; identify a function section in the quantum circuit based on the qubit, the function section commencing at a beginning cycle, the beginning cycle is ordered before the second cycle, the function section ending at an ending cycle, the ending cycle is ordered after the first cycle, the ending cycle is ordered after the commencing cycle, the function section utilizing the qubit as an auxiliary qubit; and output an indication of the function section.

Yet another exemplary embodiment of the disclosed subject matter is a computer program product comprising a non-transitory computer readable medium retaining program instructions, which program instructions when read by a processor, cause the processor to: obtain a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit; determine that the qubit is a candidate auxiliary qubit, wherein said determining comprises estimating that a state of the qubit at the first cycle is identical to a state of the qubit at the second cycle; identify a function section in the quantum circuit based on the qubit, the function section commencing at a beginning cycle, the beginning cycle is ordered before the second cycle, the function section ending at an ending cycle, the ending cycle is ordered after the first cycle, the ending cycle is ordered after the commencing cycle, the function section utilizing the qubit as an auxiliary qubit; and output an indication of the function section.

Yet another exemplary embodiment of the disclosed subject matter is a method comprising: obtaining a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit, the plurality of gates comprising a first gate and a second gate; obtaining an initial portion of the representation of the quantum circuit, the initial portion comprising the first gate, the initial portion excluding the second gate, the initial portion commencing at a first cycle and ending at a second cycle, the second cycle is ordered after the first cycle; utilizing a local search process to identify a highly-scored portion of the representation of the quantum circuit, the local search process is based on an objective function, the local search process starts from the initial portion, wherein the objective function is configured to yield a score for an analyzed portion of the representation of the quantum circuit, the score is computed based on a number of qubits in the analyzed portion of the representation of the quantum circuit that have an identical value at an initial cycle and at an end cycle, wherein the initial cycle and the end cycles of the qubits are included in the analyzed portion; identifying a function section in the quantum circuit based on the highly-scored portion of the representation of the quantum circuit; and outputting an indication of the function section.

Optionally, the local search process is configured to identify one or more extensions to at least a portion of the initial portion, wherein the extensions comprise one or more cycles or cycle portions that are added the portion of the initial portion, wherein a score of the portion of the initial portion together with the one or more extensions is a local optimum, the method further comprises determining that the highly-scored portion comprises the portion of the initial portion and the one or more extensions.

Optionally, the one or more extensions are determined by performing light-cone analyses to one or more state retaining paths associated with the initial portion.

Optionally, the selection of the initial portion is performed randomly.

Optionally, the selection of the initial portion is based on a determination that the state of the qubit at the first cycle is identical to the state of the qubit at the second cycle.

Optionally, the method further comprises performing a state inspection stage, the state inspection stage comprising inspecting a state of each of the plurality of qubits at each cycle of the plurality of cycles, wherein the state of the qubit at the first cycle is determined to be identical to the state of the qubit at the second cycle based on the state inspection stage.

Optionally, the quantum circuit is an outcome of a preprocessing step, the preprocessing step configured to: detect in an initial quantum circuit one or more patterns of at least one of: a swap operation and an identity operation; and remove the one or more patterns from the initial quantum circuit.

Optionally, the quantum circuit is an outcome of a preprocessing step, the preprocessing step configured to: detect in an initial quantum circuit one or more patterns of gate-level implementations of one or more multi-qubit gates; and replace the one or more patterns of gate-level implementations of one or more multi-qubit gates with the one or more multi-qubit gates.

Optionally, the quantum circuit is a circuit being reverse engineered without having access to a quantum program from which the quantum circuit was synthesized.

Another exemplary embodiment of the disclosed subject matter is an apparatus comprising a processor and coupled memory, said processor being adapted to: obtain a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit, the plurality of gates comprising a first gate and a second gate; obtain an initial portion of the representation of the quantum circuit, the initial portion comprising the first gate, the initial portion excluding the second gate, the initial portion commencing at a first cycle and ending at a second cycle, the second cycle is ordered after the first cycle; utilize a local search process to identify a highly-scored portion of the representation of the quantum circuit, the local search process is based on an objective function, the local search process starts from the initial portion, wherein the objective function is configured to yield a score for an analyzed portion of the representation of the quantum circuit, the score is computed based on a number of qubits in the analyzed portion of the representation of the quantum circuit that have an identical value at an initial cycle and at an end cycle, wherein the initial cycle and the end cycles of the qubits are included in the analyzed portion; identify a function section in the quantum circuit based on the highly-scored portion of the representation of the quantum circuit; and output an indication of the function section.

Yet another exemplary embodiment of the disclosed subject matter is a system comprising a processor and coupled memory, said processor being adapted to: obtain a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit, the plurality of gates comprising a first gate and a second gate; obtain an initial portion of the representation of the quantum circuit, the initial portion comprising the first gate, the initial portion excluding the second gate, the initial portion commencing at a first cycle and ending at a second cycle, the second cycle is ordered after the first cycle; utilize a local search process to identify a highly-scored portion of the representation of the quantum circuit, the local search process is based on an objective function, the local search process starts from the initial portion, wherein the objective function is configured to yield a score for an analyzed portion of the representation of the quantum circuit, the score is computed based on a number of qubits in the analyzed portion of the representation of the quantum circuit that have an identical value at an initial cycle and at an end cycle, wherein the initial cycle and the end cycles of the qubits are included in the analyzed portion; identify a function section in the quantum circuit based on the highly-scored portion of the representation of the quantum circuit; and output an indication of the function section.

Yet another exemplary embodiment of the disclosed subject matter is a computer program product comprising a non-transitory computer readable medium retaining program instructions, which program instructions when read by a processor, cause the processor to: obtain a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit, the plurality of gates comprising a first gate and a second gate; obtain an initial portion of the representation of the quantum circuit, the initial portion comprising the first gate, the initial portion excluding the second gate, the initial portion commencing at a first cycle and ending at a second cycle, the second cycle is ordered after the first cycle; utilize a local search process to identify a highly-scored portion of the representation of the quantum circuit, the local search process is based on an objective function, the local search process starts from the initial portion, wherein the objective function is configured to yield a score for an analyzed portion of the representation of the quantum circuit, the score is computed based on a number of qubits in the analyzed portion of the representation of the quantum circuit that have an identical value at an initial cycle and at an end cycle, wherein the initial cycle and the end cycles of the qubits are included in the analyzed portion; identify a function section in the quantum circuit based on the highly-scored portion of the representation of the quantum circuit; and output an indication of the function section.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
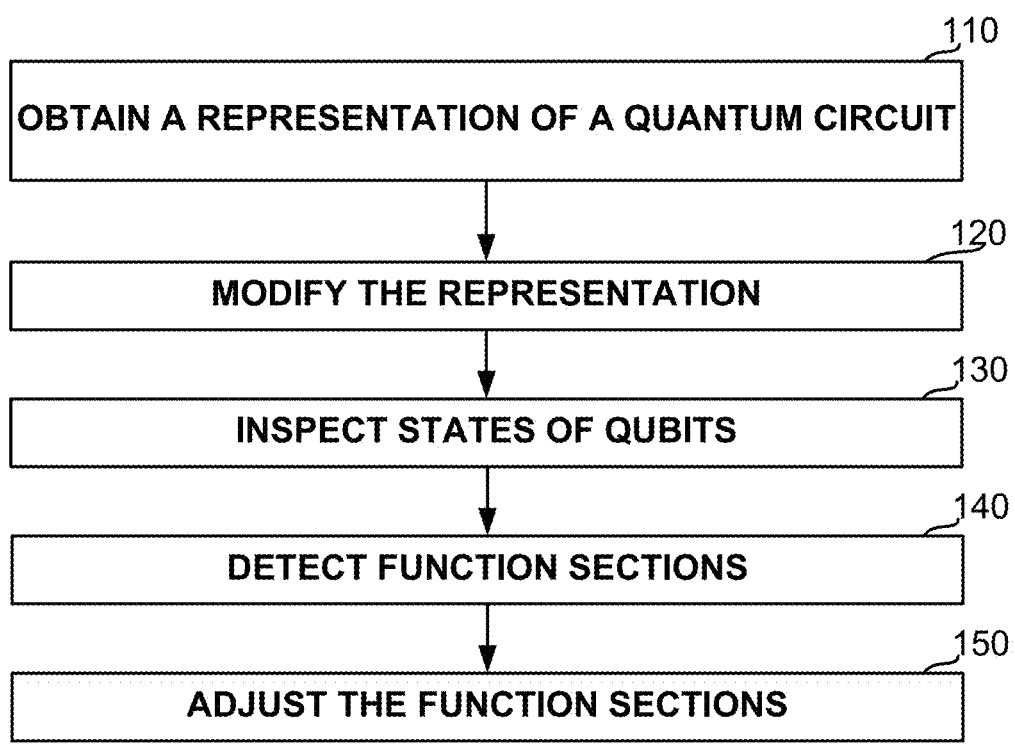
FIG. 1 illustrates an exemplary flowchart diagram of a method, in accordance with some exemplary embodiments of the disclosed subject matter.

One technical problem dealt with by the disclosed subject matter is determining a functionality of a representation of a quantum circuit, e.g., a gate-level representation. In some exemplary embodiments, it may be desired to understand a structure or functionality of a quantum circuit, such as in order to perform reverse engineering of the circuit, for optimization of the quantum circuit, for performance analysis, or the like. For example, a high-level representation of the circuit may not be available. In some exemplary embodiments, it may be challenging to infer a functionality of a gate-level quantum circuit that is unknown.

In some exemplary embodiments, one or more high-level programming languages may be used for programming a high-level quantum program, in an abstract form that does not necessarily refer to a qubit set, a gate set, or the like. For example, a high-level quantum program may be programmed using functional-level code, using evolutionary computing techniques such as Quantum Genetic Algorithm (QGA), using genetic algorithms, or the like. In some exemplary embodiments, a high-level quantum program may specify high-level functions, low level components such as gates, a combination thereof, or the like. In some exemplary embodiments, a high-level quantum program may comprise one or more function blocks. In some exemplary embodiments, a functional block may be a logical abstraction of a sub-circuit having a predetermined functionality. In some exemplary embodiments, functional blocks may represent separate functionalities of the circuit. For example, a functional block may comprise an 'add' operation that is configured to obtain two input qubits, and provide at least one output qubit that sums up the states of the input qubits. In some exemplary embodiments, the functional block may represent a sub-circuit that is executed over two or more cycles, using two or more qubits, using two or more quantum gates, or the like.

In some exemplary embodiments, a high-level quantum program may be compiled, transpiled, translated, or the like, such as by translating the high-level quantum program from a high-level quantum program to an Intermediate Representation (IR), including a language-independent intermediate representation of the code, and then to a gate-level implementation. In some exemplary embodiments, the gate-level implementation may be converted to a logical program by scheduling each gate of the gate-level implementation within a logical program, allocating qubits and cycles for each gate, connecting qubits from some gates to other gates, or the like. In some exemplary embodiments, the logical program may be converted to an executable quantum circuit that is machine-specific, and may comprise a machine representation that can be executed by a quantum computer, a logical program that can be executed or simulated by a classic computer or engine, or the like.

In some cases, a third party may obtain an implementation of at least a portion of a high-level program, such as a logical program, without obtaining the high-level program itself. In some exemplary embodiments, the implementation may comprise a gate-level representation of a quantum circuit or portion thereof, an IR representation of a quantum circuit or portion thereof, or the like. In some exemplary embodiments, it may be challenging to detect functional blocks defined by the high-level program, based on the gate-level representation. In some exemplary embodiments, since functional blocks may represent separate functionalities of the circuit, the overall functionality of the circuit may be estimated based on inferring functional blocks of the circuit. It may be desired to estimate, based on an implementation of a high-level program, the functional blocks of the high-level program. For example, it may be desired to obtain a gate-level representation of a circuit and infer therefrom functional blocks of a high-level representation of a circuit.

Another technical problem dealt with by the disclosed subject matter is to identify sections of the implementation that implement respective functional blocks. In some exemplary embodiments, dividing the implementation into one or more sections of functionality, referred to as function sections, may enable to map the implementation into the respective functional-level code. For example, dividing or segmenting the implementation of the circuit to accurate function sections may enhance a reverse engineering process, by enhancing an effort of converting sections of the circuit to respective functional blocks. In some exemplary embodiments, it may be desired to identify sections of the implementation of the quantum circuit that represent functional blocks, high-level functions, or the like.

One technical solution provided by the disclosed subject matter may comprise dividing a representation of a quantum circuit into function sections that represent functional blocks. In some exemplary embodiments, the representation of the quantum circuit may comprise at least one gate-level portion that comprises one or more low level components such as gates.

In some exemplary embodiments, prior to dividing the representation into function sections, one or more preparatory operations may be applied to the representation during one or more preparatory stages, e.g., according to Steps 120 and 130 of FIG. 1. In some exemplary embodiments, a preparatory stage may include adjusting the representation to remove redundant portions of the circuit that are not helpful for the task of dividing the representation into function sections. For example, implementation-specific portions of the circuit may be redundant, as they may cause the representation of the circuit to become unclear and confusing, while not adding logical value to the function sections. In some cases, the preparatory stage may include removing redundant portions, such as swap and identity operations, from the circuit representation. In some cases, the preparatory stage may include ignoring redundant portions without removing them from the circuit.

In some exemplary embodiments, a preparatory stage may comprise replacing sections of the circuit that match a pattern of a specific multi-qubit gate, e.g., a complex multi-qubit gate, with a logical indication of the respective multi-qubit gate. For example, a detected pattern of a CNOT gate may be replaced with a box, or other visual representation of the CNOT gate. In some exemplary embodiments, any other preparatory stages may be implemented in order to remove redundant portions of the circuit, increase a clarity level of the circuit, replace circuit portions with logical representations, or the like.

In some exemplary embodiments, a preparatory stage may comprise an inspection stage, in which states of qubits that are manipulated by the circuit in each depth, may be inspected. In some exemplary embodiments, a depth of a circuit may refer to a number of cycles from the initial cycle (e.g., cycle 0) until one or more subsequent cycles. In some exemplary embodiments, at every depth of the circuit, the states of the qubits may be inspected, measured, or the like, such as by using tomography techniques. For example, tomography techniques may be applied by executing the original representation.

In some exemplary embodiments, after completing one or more preparatory stages, e.g., all of the preparatory stages, one or more division schemes may be utilized for identifying at least one function section that represents a functional block, in the resulting representation. For example, a division scheme may be utilized for dividing the representation into one or more function sections, each of which representing a functional block. As another example, the division schemes may implement the method of FIG. 2, the method of FIG. 4, or the like. In some exemplary embodiments, the division schemes may utilize the inspected states of the qubits, that were inspected at the inspection stage, in order to detect patterns of interest in the circuit, that are associated with function beginnings and ends.

In some exemplary embodiments, one or more patterns of interest in the circuit may comprise qubit states or state transitions that are indicative of borders of a function. For example, in case of an auxiliary qubit scenario, the auxiliary qubits may be released from a sub-circuit in a same state in which it was provided to the sub-circuit. In some exemplary embodiments, this may be considered a pattern of interest, since the sub-circuit may represent a functional block that obtains the auxiliary qubit, manipulates the auxiliary qubit, and then releases the auxiliary qubit (e.g., by performing an uncompute operation thereon). In some exemplary embodiments, another pattern of interest may include an input qubit scenario, which may be include a qubit that is not modified by the function. In some exemplary embodiments, such scenarios may be detected based on the inspected states of the qubits, that were inspected at the inspection stage. In some exemplary embodiments, finding where an auxiliary qubit enters a function and where it is released from the function may assist with finding the corpus of the functional block, implemented by a function section of the representation.

In some exemplary embodiments, one or more division schemes may obtain an indication of one or more initial portions of the representation, e.g., based on analyzing the representation and detecting a pattern of interest, based on a random selection, or the like. In some exemplary embodiments, each initial portion, or a portion thereof, may be assumed to belong to a single function section. In some exemplary embodiments, the initial portion may be selected to include a connected component of the circuit, e.g., a component that does not comprise two detached portions. In other cases, the initial portion may comprise two or more detached components of the circuit. In some exemplary embodiments, after obtaining an indication of an initial portion, one or more patterns of interest may be detected in association with the initial portion. In some exemplary embodiments, one or more portions of the representation that are associated to the initial portion, may be estimated to belong to a same function section, and may be added to the initial portion.

For example, a light-cone analysis may be applied with respect to identified patterns of interest in the initial portion, in neighboring areas, or the like, and may be used to extend the initial portion. In some exemplary embodiments, a light-cone analysis may be used to detect an impact of a component of the circuit, such as a gate component, by spreading a graph of a function section to areas of the circuit that are affected by the gate component. In some exemplary embodiments, applying a light-cone analysis to the initial portion of the circuit may enable to identify the areas of the circuit that are affected by the initial portion, which may be estimated to belong to a same function section as the initial portion.

In some exemplary embodiments, after implementing one or more division schemes in order to detect respective function sections, one or more post-processing operations may be performed. For example, post-processing operations may be configured to increase the area of the determined function section with one or more adjacent cycles. This may be performed in order to ensure the detected function section is complete, and includes all of the gate-level portions that implement a respective functional block.

One technical effect provided by the disclosed subject matter is enabling to identify function sections in an unknown gate-level representation of a circuit. In some exemplary embodiments, function sections may be identified with a high accuracy without having access to a high-level representation of the circuit.

Another technical effect provided by the disclosed subject matter is mapping function sections to high-level functional blocks, thereby reconstructing the high-level representation of the circuit and enabling to perform reverse engineering, performance analysis, optimizations, or the like.

The disclosed subject matter may provide for one or more technical improvements over any pre-existing technique and any technique that has previously become routine or conventional in the art. Additional technical problem, solution and effects may be apparent to a person of ordinary skill in the art in view of the present disclosure.

Referring now to FIG. 1, showing an exemplary flowchart diagram of a method, in accordance with some exemplary embodiments of the disclosed subject matter.

On Step 110, a representation of a quantum circuit may be obtained. For example, the representation may comprise a gate-level representation of the quantum circuit. In some exemplary embodiments, the representation may comprise a plurality of qubits that are manipulated by a plurality of gates over a plurality of cycles. In some exemplary embodiments, the quantum circuit may be a circuit that is reverse engineered by performing Step 120-150, without having access to a quantum program from which the quantum circuit was synthesized.

It is noted that the term 'qubit', as used herein, may refer to an individual qubit or to a group of one or more qubits that cooperate in representing a quantum state.

On Step 120, the representation may be modified, such as during one or more preparatory stages. In some exemplary embodiments, the preparatory stages may comprise one or more pre-processing stages that are configured to perform one or more pre-processing operations.

For example, a first preparatory or preprocessing stage may comprise detecting patterns of implementation-specific operations, such as swap and identity operations, in an initial version of the representation. In some exemplary embodiments, implementation-specific operations, such as swap and identity operations, may be detected by identifying known or defined patterns of swap and identity operations in the representation. In some exemplary embodiments, the patterns of operations may comprise patterns of gates, patterns of qubits that are manipulated by one or more gates, or the like. For example, a pattern of a swap operation may include multiple swap gates between adjacent qubits, in a sequential manner. In some exemplary embodiments, the patterns may be detected using one or more libraries of swap and identity patterns, using a trained machine learning detector of swap and identity patterns, using a classifier, using a segmentation model, or using any other technique or mechanism. For example, a library may provide indications of patterns that match swap and identity operations.

In some exemplary embodiments, after detecting patterns of swap operations, identity operations, or the like, the detected patterns may be removed from the representation of the circuit, thereby modifying the representation. For example, the representation may be analyzed to detect therein patterns of a swap operation, patterns of an identity operation, or the like, and the patterns may be removed from the representation prior to one or more subsequent steps of the method, such as prior to Steps 130, 140, 150, or the like. In other cases, the detected patterns may be ignored in further processing of the representation, marked as unimportant, or the like. For example, instead of removing the patterns, the representation may be marked (e.g., visually, textually, or the like) to identify, for example with respect to a swap operation, that a state of a first qubit was swapped with a state of a second qubit at a specific cycle, time, range of cycles, or the like.

In some exemplary embodiments, detected swap and identity operations may be removed since they are implementation-specific and are therefore not helpful for detecting function sections. In some exemplary embodiments, an adjusted or modified representation of the circuit, that is absent of swap and identity operations, may be more useful for detecting function sections, compared with a representation that includes the swap and identity operations, at least since swap and identity operations may cause the representation of the circuit to become unclear and confusing. For example, swap or identity operations may cause a gate-level implementation to look as if detached qubits that are not connected, are seemingly connected. In some exemplary embodiments, removing the swap and identity operations may clean the representation of the circuit from unnecessary redundant portions, noise, or the like.

As another example, a second preparatory or preprocessing stage may comprise detecting patterns of known multi-qubit gate types, of complex gate types, or the like, in an initial version of the representation, and replacing the patterns with the matching gate type. In some exemplary embodiments, known gate-level implementations or patterns of multi-qubit gates may be obtained, such as from a library, and the representation may be searched to identify such implementations or patterns therein. In some exemplary embodiments, identified implementations or patterns of multi-qubit gates may be replaced with the multi-qubit gates themselves, which may comprise a logical indication of the respective multi-qubit gates, a representation of the multi qubit gate, or the like. For example, a library may retain patterns that match quantum gates of various types such as Pauli gates, square root of NOT gates, controlled gates, CNOT gates, CX gates, CY gates, CZ gates, phase shift gates, controlled phase shift gates, Hadamard gates, Toffoli gates, or the like. In some exemplary embodiments, the second preparatory stage may be performed prior to one or more subsequent steps of the method, such as prior to Steps 130, 140, 150, or the like. In some exemplary embodiments, an outcome of the first preparatory stage, the second preparatory stage, a combination thereof, or the like, may be provided for further analysis to Step 130, 140, or the like.

On Step 130, qubit states may be inspected, e.g., as part of a state inspection stage (also referred to as an 'inspection stage'). In some cases, the inspection stage may comprise a preprocessing stage that is performed prior to the analysis of Step 140. In some exemplary embodiments, the state inspection stage may comprise inspecting a state of each of the plurality of qubits of the representation, or portion thereof, at an individual qubit level or at a quantum register level. The states of the qubits may be inspected at each cycle of the plurality of cycles of the representation, e.g., in the initial non-adjusted form of the representation, in a modified form obtained from Steps 110 and/or 120, or the like. In some exemplary embodiments, inspecting a state of a qubit may include executing a circuit and sampling the qubits' states multiple times, using density matrices of the qubits to inspect their states, using a full program tomography to inspect their states, or the like, and estimating the state of the qubit based thereon. For example, qubit states may be inspected using quantum tomography. It is noted that in case the inspection stage utilizes executions of the representation, the original version of the representation may be executed, e.g., a version to which one or more preparatory stages were not applied, while results of the inspection stage may be applied to an output of the preparatory stages.

In some exemplary embodiments, a state of a qubit, as used herein, may refer to a state of an individual qubit, or to a state of a quantum register (e.g., a subset of qubits). In some exemplary embodiments, states of qubits may be inspected at each depth of the circuit. In some exemplary embodiments, a depth of a circuit may refer to a number of cycles of the circuit. For example, for a circuit with n cycles, the circuit may be considered to have a depth of n. According to this example, a circuit may be executed a defined number of times at each of the 50 depths (e.g., using the original representation), and the resulting states of the qubits may be sampled after each execution. The samples may be averaged, or otherwise statistically processed, to determine an estimated state of each qubit. In some cases, at each depth of the circuit, the states of the qubits in the cycle may be sampled, measured, inspected, or the like. As an example, for a circuit of depth n, the representation of the circuit may be divided into n subcircuits of depth i (where i≤n), which may be executed separately and sampled, measured, or otherwise inspected. In some exemplary embodiments, each subcircuit of depth i may include the representation from the initial cycle, e.g., cycle 0, to cycle i−1. For example, the circuit may be divided to n subcircuits including a first subcircuit including the first cycle with depth 1, a second subcircuit including the first and second cycle with depth 2, and so on, while the last subcircuit includes all of the cycles of the circuit with depth n. In other cases, the representation may be divided into any other subcircuits. In some exemplary embodiments, inspecting states of the qubits may comprise executing or simulating each subcircuit of depth i independently, separately, or the like, and sampling the states of the qubits at the last cycle of each subcircuit. In other cases, the circuit may be executed or simulated once, and states of the qubits may be sampled multiple times based thereon.

In some exemplary embodiments, quantum tomography, or any other inspection method, may be performed until reaching a desired quality level (e.g., confidence level in measurement, estimated statistical deviation, or the like), or the like. In some exemplary embodiments, in case subcircuits of different depths are executed, the states of the qubits in each subcircuit of depth i may be inspected by performing quantum tomography on qubits in cycle i. For example, the states of the qubits or portion thereof may be inspected at the last cycle of the subcircuit.

On Step 140, function sections may be detected in the representation, e.g., based on the inspected states of the qubits. In some exemplary embodiments, function sections may be detected in a modified representation of the circuit that was modified on Step 120. In some exemplary embodiments, function sections may be detected by one or more division schemes that may be configured to identify at least one function section in the representation, divide the representation of the circuit into two or more respective function sections, or the like. In some exemplary embodiments, the function sections may be estimated to represent respective functional blocks of a functional-level representation of the quantum circuit.

In some exemplary embodiments, a division scheme may be configured to obtain a selection of an initial portion of the representation. In some exemplary embodiments, the initial portion may not comprise the entire representation. For example, the representation may comprise first and second quantum gates, and the initial portion may comprise the first gate but exclude the second gate. In some exemplary embodiments, the initial portion may comprise at least one path of a qubit from a first cycle of the plurality of cycles to a second cycle of the plurality of cycles. For example, the first and second cycles may not be adjacent cycles, as at least one intermediate cycle may separate the cycles. In some cases, the path of the qubit may comprise a path of a quantum register between cycles, or a path of an individual qubit between cycles.

In some exemplary embodiments, the initial portion may be selected based on one or more calculations, parameters, heuristics, classifiers, randomly, or the like. For example, a division scheme may be configured to randomly select the initial portion. According to this example, one or more limits on the number of cycles and components, a connectivity thereof, or the like, may be applied when randomly selecting the initial portion, such as in order to prevent a selection that includes portions of different functions, that includes detached portions, or the like. As another example, a division scheme may be configured to select the initial portion to include a state retaining path, which may comprise a path of a qubit between first and second non-adjacent cycles, in case a state of the qubit at the first cycle is determined, by the state inspection stage, to be identical to a state of the qubit at the second cycle. As another example, a division scheme may be configured to select the initial portion to include a state retaining path of an auxiliary qubit, including a path of an auxiliary qubit from a first cycle to a second cycle, in which the state of the qubit at the first cycle is identical to the state of the qubit at the second cycle, and different from a state of the qubit at an intermediate cycle between the first and second cycles. As another example, a division scheme may be configured to obtain the selection of the initial portion in any other way, such as by obtaining the selection from a remote server, selecting the initial portion based on any other determination, or the like.

In some exemplary embodiments, a first function section of the two or more function sections may be determined to comprises at least the initial portion. In some exemplary embodiments, one or more methods may be used to extend the initial portion to include the first function section in its entirety, an increased portion of the first function section, or the like. In other cases, the initial portion may be determined to include the entire first function section. For example, the methods of FIGS. 2 and 4 may represent exemplary extension methods for extending the initial portion to cover the first function section. In some exemplary embodiments, function sections may be identified iteratively, each time by obtaining a selection of an initial section in the remaining portions of the representation, until the entire representation is covered and divided into function sections. In some cases, after each iteration, or after all of the iterations, Step 150 may be performed.

In some exemplary embodiments, a state retaining path of an auxiliary qubit may be detected in the representation, e.g., based on the state inspection stage. In some exemplary embodiments, the auxiliary qubit may be detected by detecting a state retaining path of a qubit between first and second (non-adjacent) cycles, in case a state of the qubit at the first cycle is identical to a state of the qubit at the second cycle, and different from a state of the qubit at an intermediate cycle. For example, a state retaining path of an auxiliary qubit may be detected in case a state of a qubit starts off with a first state, is manipulated to one or more second states, and then is restored to the first state in one or more subsequent cycles, such as by using an uncompute operation. In some exemplary embodiments, the state retaining path may indicate that the qubit complies with one or more auxiliary properties when being used by a function between the first and second cycles. In some cases, the state of the qubit at the first and second cycles may refer to a state of an individual qubit, or to a state of a quantum register. In case that a quantum register does not have a same state at the first and second cycles, the path of the quantum register between the first and second cycles may not be considered a state retaining path of the quantum register, e.g., even in case that states of some or all of the individual qubits within the quantum register at the second cycle are identical to the state of the quantum register at the first cycle.

In some exemplary embodiments, functions may typically utilize one or more auxiliary qubits as temporary workspace that may not be part of a quantum function logic flow. For example, auxiliary qubits may comprise qubits that do not store any information relevant to the quantum circuit's output. In some exemplary embodiments, clean auxiliary qubits may comprise auxiliary qubits whose states or values before being manipulated by the function are known, while dirty auxiliary qubits may comprise auxiliary qubits whose states or values before being manipulated by the function are unknown. In some exemplary embodiments, auxiliary qubits may comply with one or more auxiliary properties. For example, an auxiliary property may require auxiliary qubits to be released from a function in a same (known or unknown) state in which it was provided to the function. As another example, an auxiliary property may require qubits to be disentangled from other input qubits.

Figure 2:
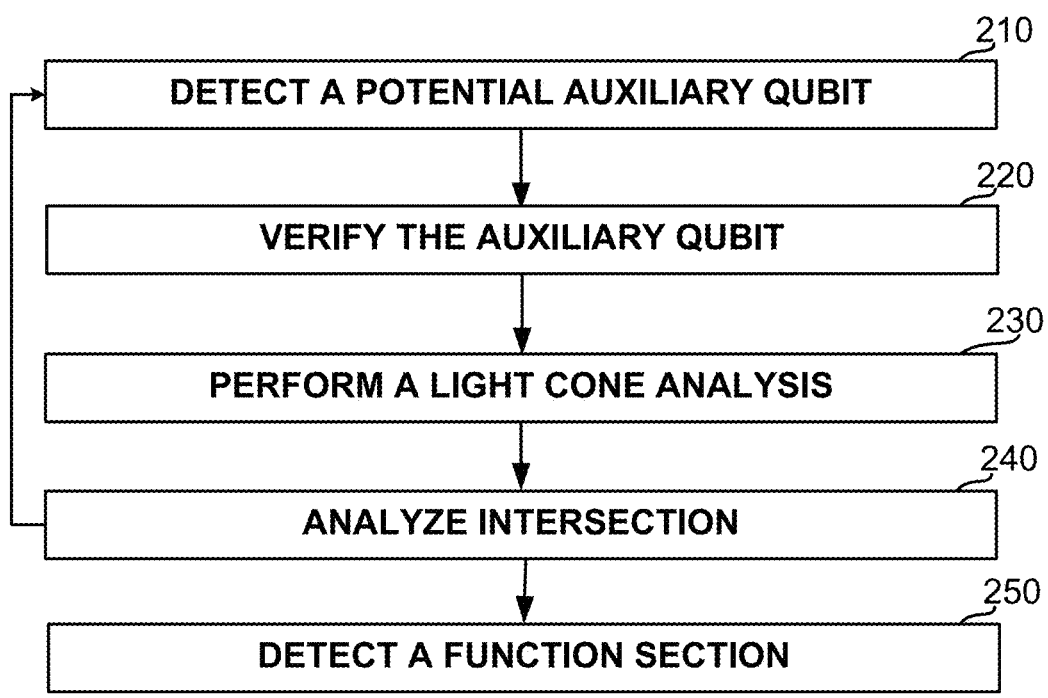
FIG. 2 illustrates an exemplary flowchart diagram of a method, in accordance with some exemplary embodiments of the disclosed subject matter.

In some exemplary embodiments, a division scheme, such as the division scheme of FIG. 2, may utilize the auxiliary property that requires qubits to be released from a circuit in a same state in which it was provided to the circuit, in order to find a state retaining path of an auxiliary qubit within the representation. In some exemplary embodiments, in case a state retaining path of a qubit is found, and the qubit has a measured different state at one or more intermediate cycles between the first and second cycles, the qubit may be estimated to be an auxiliary qubit that enters the function at the first cycle, is manipulated by the function, and is released from the function with a restored state at the second cycle.

In some exemplary embodiments, according to this division scheme, the initial portion may be selected to include the state retaining path of the qubit. In some exemplary embodiments, in order to extend the initial portion to reach the borders of the respective function section, a light-cone analysis may be applied to borders of the path. In some exemplary embodiments, the light-cone analysis may be configured to identify gates in the quantum program that are connected to a the initial portion of the circuit, which may also belong to the same function section. In some exemplary embodiments, a forward light-cone analysis may be performed from the first cycle until the last cycle of the state retaining path. In some exemplary embodiments, a backward light-cone analysis may be performed from the second cycle until a first cycle of the state retaining path.

In some exemplary embodiments, a forward light-cone analysis from a circuit component may comprise a forward cone of influence of the circuit component; this includes all gates or other circuit components that are connected to the circuit component directly or indirectly, and are positioned in one or more cycles after the circuit component. For example, the forward light-cone analysis from a circuit component may comprise a gate component with at least one input qubit that is connected to output qubits of the circuit component. In some exemplary embodiments, the forward light-cone analysis from a circuit component may comprise only elements that are directly connected to the circuit component, or elements that are directly and indirectly connected thereto. For example, the forward light-cone analysis may comprise first components that are connected directly to the circuit component, second components that are connected directly to the first components, and so on, iteratively, until reaching the entire cone of influence of the circuit component. As another example, in case a circuit component comprises a gate that outputs two qubits, and the two qubits are connected to two second gates, the two second gates may be included in the forward light-cone of the circuit component. In some exemplary embodiments, the forward light-cone analysis from a circuit component may not comprise circuit components in all cycle directions; only components in the direction of execution, that are in a same cycle or a greater cycle than the circuit component, may be included in a forward light-cone analysis from the circuit component.

In some exemplary embodiments, a backward light-cone analysis from a circuit component may comprise a backward cone of influence of the circuit component; this includes all gates or other circuit components that are connected to the circuit component directly or indirectly, and are positioned in cycles before the circuit component, in the opposite direction of the direction of execution. For example, the backward light-cone analysis may comprise a gate component with at least one output qubit that is connected to input qubits of the circuit component. In some exemplary embodiments, a backward light-cone analysis may define that a first gate is external to (e.g., not included in) the backward light-code of a second gate, in case the forward light-cone from the first gate does not include the second gate.

In some exemplary embodiments, an intersection between the forward light-cone analysis and the backward light-cone analysis may be determined to belong to the same first function section. In some exemplary embodiments, in case a path of a specific qubit from cycle A to cycle B (B>A) is included in the initial portion, and is estimated to be included in a single function section, then any qubit in the intersection between the forward light-cone from gates of cycle A and between the backward light-cone from gates of cycle B may be estimated to belong to the function as well, with a high probability.

In some exemplary embodiments, the intersection may be analyzed, to detect any additional qubits therein. In some exemplary embodiments, additional qubits may comprise qubits that were not included in the initial portion. In some exemplary embodiments, the additional qubits, as well as any qubit of the initial portion, may be analyzed to detect whether the intersection includes part of state retaining paths of the qubits. In such cases, the intersection may be extended to include the state retaining paths, and the additional qubits may be analyzed. This may be performed iteratively, until no more state retaining paths of qubits that are included in the intersection, and cross through at least a portion of the intersection, are detected.

Figure 4:
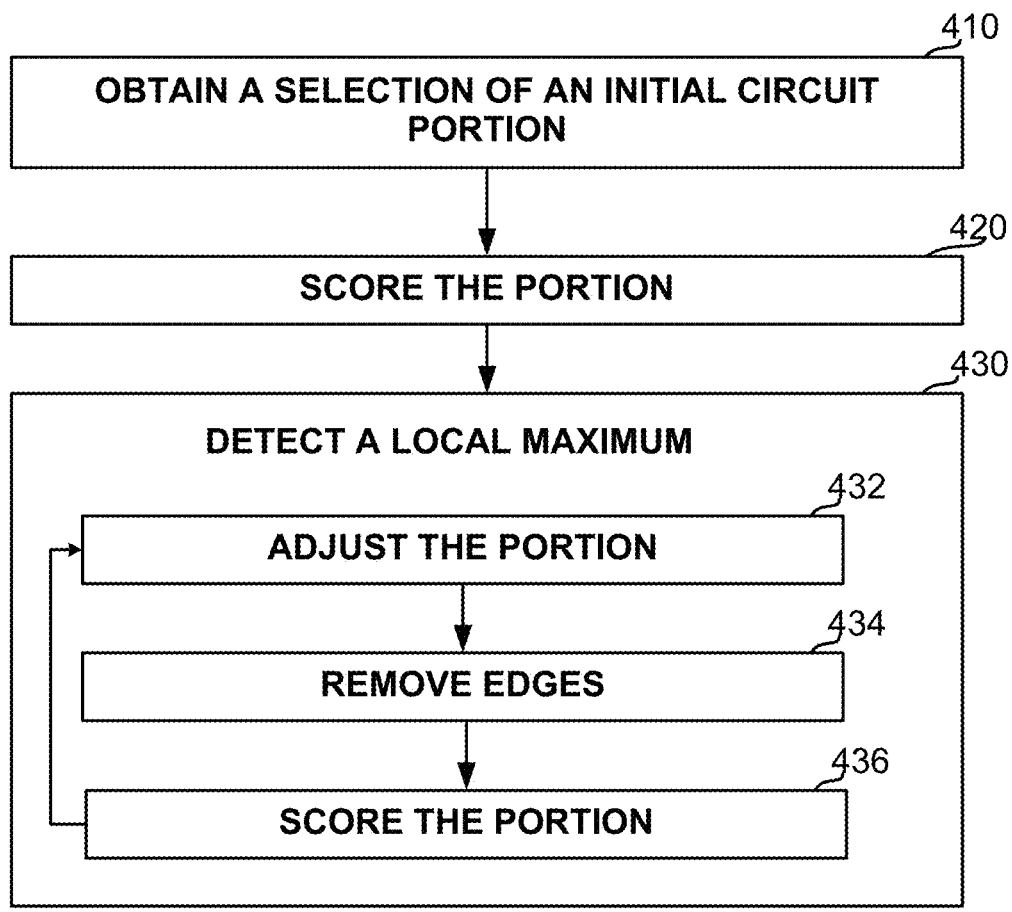
FIG. 4 illustrates an exemplary flowchart diagram of a method, in accordance with some exemplary embodiments of the disclosed subject matter.

In some exemplary embodiments, another division scheme, such as the division scheme of FIG. 4, may utilize an objective function in order to extend the initial portion. In some exemplary embodiments, the objective function may be configured to obtain an indication of a section of the representation, and compute a score for the section based on a number of state retaining paths that are detected in the section. In some exemplary embodiments, the objective function may be used to compute a score for the initial portion, an extension thereof, or the like. For example, the objective function may score the initial portion based on the number of state retaining paths in the initial portion.

In some exemplary embodiments, a local search may be utilized in order to score multiple extensions of the initial portion, and detect an extension that results with a score that is a local optimum. For example, extensions to the initial portion may comprise intersections of forward and backward light-cone analyses that are performed with respect to one or more detected state retaining paths in the initial portion or in an extension thereof. As another example, extensions to the initial portion may comprise a forward light-cone analysis, a backward light-cone analysis, or the like, which may be performed iteratively in order to increase the initial portion with additional adjacent cycles, circuit components, or the like. In some cases, extensions to the initial portion may be limited by one or more termination conditions, e.g., by Step 434 of FIG. 4.

In some exemplary embodiments, an extension to the initial portion may comprise one or more cycles or cycle portions that are adjacent to the initial portion, are connected thereto, or the like. In some exemplary embodiments, the detected extension that results with the local optimum, together with the initial portion, may be determined to belong to the first function section. In some exemplary embodiments, the local optimum may comprise a score from the objective function that constitutes a local maximum, indicating a highest number of state retaining paths.

On Step 150, after implementing one or more division schemes, and detecting thereby one or more respective function sections, such as the first and second function sections, the function sections may or may not be fine-tuned using one or more post-processing schemes. In some cases, post-processing schemes may be applied after each detection of a function section by Step 140, or after all the function sections are detected by Step 140.

In some cases, the division schemes may, in some cases, result with a function section that is incomplete, as it may be absent of one or more gate-level portions that do in fact belong to the function section. For example, a function section may be considered incomplete, in case the function section comprises an implementation of a functional block of a high level program, but does not include part of the implementation of the functional block. In some cases, a small number of cycles, such as one or two cycles or portions thereof in a left and/or right side of a detected function section, may belong to the function section but may not be added to the function section due to various reasons. For example, such cycles may not comprise uncompute operations.

In some exemplary embodiments, in order to ensure the detected function section is complete, an area of the function section may be increased by one or more cycles or portions thereof that are positioned before the detected function section, after the detected function section, or the like. In some exemplary embodiments, a post processing scheme may be configured to add one or more circuit components to a function section based on a library of implementations, a machine learning classifier, or the like. For example, a machine learning classifier or a segmentation module may be trained on a dataset including multiple gate-level implementations of functional blocks, and may be used to adjust borders of a sub-circuit to include one or more missing cycles, components, or the like, based on the trained dataset.

In some exemplary embodiments, a post processing scheme may be configured to add one or more portions of the circuit to the function section based on a distance function that calculates a distance between a library component and the function section. In some exemplary embodiments, a library with gate-level implementations of multiple functional blocks, e.g., thousands of quantum functions, hundreds of quantum functions, or the like, may be obtained, created, or the like. In some exemplary embodiments, the corpus of library implementations may be queried, in order to find therein a library implementation that is most similar to the detected function section, such as by using a distance function to determine a distance between the function section and each library implementation. In some exemplary embodiments, a closest library implementation that results with a smallest distance from the sub circuit, may be detected. In some cases, the closest library implementation may be used to define the borders of the function section instead of the existing borders determined on Step 140. In some exemplary embodiments, the library implementation may only be utilized in case it increases the borders of the function section without decreasing the borders. In some cases, the closest library implementation may not replace the borders of the function section, but may rather be used as an indication of whether or not a portion of a circuit should be added to the function section. For example, a distance function may be used to determine whether adding a circuit component to the function section increases a distance of the function section to the closest library implementation, or decreases the distance of the function section to the closest library implementation. In some exemplary embodiments, based on such a determination, the circuit component may be determined to be added to the function section or not to be added thereto.

Referring now to FIG. 2, showing an exemplary flowchart diagram of a method, in accordance with some exemplary embodiments of the disclosed subject matter.

On Step 210, a potential auxiliary qubit may be detected in the representation of the circuit (e.g., corresponding to the representation of Step 110 of FIG. 1), by detecting a state retaining path thereof. In some exemplary embodiments, based on the inspected states of the qubits at each cycle, the circuit may be analyzed to identify a state retaining path of a qubit that complies with an auxiliary property, e.g., that has a state that is restored, which may be indicative of an uncompute operation. A state retaining path of a qubit may be estimated to have identical states at first and second cycles, such as in case a confidence score of the measured states of the qubit, alone or in combination, is greater than a threshold. In some exemplary embodiments, detected qubits that are estimated to comply with the auxiliary state may be considered candidate auxiliary qubits that are potentially auxiliary qubits. In some exemplary embodiments, a qubit may be considered to be a potential auxiliary qubit with respect to a state retaining path of the qubit between a specific range of cycles. For example, a qubit that is estimated to have a value of zero at a first cycle and third cycle, and a non-zero measured value at one or more second intermediate cycles between the first and third cycles, may be considered or determined to be a candidate auxiliary qubit with respect to a path of cycles that ranges from the first cycle to the third cycle.

In some exemplary embodiments, potential auxiliary qubits may be identified in any other manner. For example, auxiliary qubits may be identified using one or more identification algorithms that are disclosed in U.S. patent application Ser. No. 17/664,742, titled 'Auxiliary Qubit Detection In Quantum Circuits', filed May 24, 2022, which is hereby incorporated by reference in its entirety for all purposes without giving rise to disavowment.

On Step 220, one or more verification processes may be used to verify whether or not a potential auxiliary qubit is an auxiliary qubit. In some exemplary embodiments, a qubit that is validated or verified may be identified as an auxiliary qubit, determined to be an auxiliary qubit, or the like. In some exemplary embodiments, potential auxiliary qubits may be validated as auxiliary qubits, such as by utilizing one or more auxiliary verification tests, as disclosed U.S. patent application Ser. No. 17/752,282, titled 'Auxiliary Qubit Verification In Quantum Circuits', filed May 24, 2022, which is hereby incorporated by reference in its entirety for all purposes without giving rise to disavowment. For example, an auxiliary verification test may comprise a testing circuit that may be synthesized to include the quantum circuit, along with one or more testing components such as one or more quantum state setters, reverse state setters, state inspectors, reverse circuits, or the like. According to this example, the testing circuit may be utilized to verify or refute that a qubit has an auxiliary property. The testing circuit may provide a result that indicates whether or not qubits that are estimated to be auxiliary qubits are in fact auxiliary qubits, e.g., whether they comply with one or more auxiliary properties. In some cases, the state setters may be utilized to set states to the plurality of qubits prior to the qubits entering the quantum circuit, and the inverse state setters may be utilized to inverse the states of the plurality of qubits after exiting the quantum circuit. It is noted that in case a verification process is configured to perform circuit executions, the original version of the circuit representation may be executed, e.g., a version to which one or more preparatory stages were not applied.

In some exemplary embodiments, the potential auxiliary qubit may not be verified in all scenarios. For example, in case identification algorithms are used to detect dirty auxiliary qubits, Step 220 may, in some cases, be redundant with respect to the detected qubits, thus causing Step 220 not to be performed. In some exemplary embodiments, in case an individual qubit is not verified as an auxiliary qubit, this may not necessarily mean that the qubit is not an auxiliary qubit. For example, the qubit may belong to a set of one or more auxiliary qubits that cooperatively represent a single state, and thus behave as an auxiliary qubit only as a group. In such cases, a verification process may test whether groups of qubits comply with auxiliary properties, in addition to or instead of testing individual qubits.

On Step 230, a light-cone analysis may be performed with respect to the verified or detected auxiliary qubits, e.g., subsequent to Step 210 or 220. For example, the light-cone analysis may enable to determine or detect a function section in the representation of the circuit, that implements a functional block of a quantum program, and utilizes a verified auxiliary qubit as an auxiliary qubit. In some exemplary embodiments, a light-cone analysis may be performed at borders of a state retaining path of an auxiliary qubit between first and second cycles. In some exemplary embodiments, the light cone analysis may include performing a forward light-cone from a cycle at or adjacent to a start of the state retaining path (e.g., the first cycle), and performing a backward light-cone from a cycle at or adjacent to an end of the state retaining path (e.g., the second cycle). For example, the light cone analysis may comprise an iterative process in which backward light-cone and forward light-cone are performed simultaneously, subsequently, iteratively, periodically, or the like. As an example, the light cone analysis may comprise iteratively performing forward light-cone analysis of one or more qubits or gates from the first cycle and performing backward light-cone analysis of the one or more qubits or gates from the second cycle, until no additional qubits or gates are identified in an intersection of the forward light-cone analysis and the backward light-cone analysis. According to this example, the backward light-cone may be performed iteratively until reaching the first cycle at a start of the state retaining path, while the forward light-cone may be performed iteratively until reaching the last cycle at an end of the state retaining path.

On Step 240, an intersection between the forward light-cone and the backward light-cone may be detected and analyzed. In some exemplary embodiments, a function section associated with a state retaining path of a qubit may be determined to comprise at least the one or more qubits or gates identified in the intersection. In some cases, the function section may utilize, as an auxiliary qubit, the qubit, the one or more qubits, or the like. In some cases, the function section may commence at a beginning cycle, and end at an ending cycle. For example, the beginning cycle may be the first cycle or an adjacent ordered cycle (e.g., a later cycle, an earlier ordered cycle, or the like), and may be ordered before the second cycle. In some exemplary embodiments, the ending cycle may comprise the second cycle or an adjacent ordered cycle (e.g., a later cycle, an earlier ordered cycle, or the like), and may be ordered after the first cycle.

In some exemplary embodiments, in order to extend the function section, an iteratively search for a next candidate auxiliary qubit that is associated with the intersection may be performed. For example, each qubit in the intersection may be analyzed, to determine whether the qubit is a potential auxiliary qubit, a next candidate auxiliary qubit, or the like. In some exemplary embodiments, qubits in the intersection may be analyzed to determine whether they are part of a state retaining path that has one or more cycles that overlap with cycles of the intersection. For example, a qubit may be considered to be a next candidate auxiliary qubit in case it has a state retaining path between third and fourth cycles, and at least one cycle between the third and fourth cycles is included in the intersection. In some exemplary embodiments, in case a state retaining path of qubit is detected in the intersection, the qubit may be considered a potential auxiliary qubit, and an iterative process may be performed to extend the intersection to include the state retaining path, and to further search for next candidate auxiliary qubits within the extended intersection (e.g., a second, different, intersection). As an example, in order to detect the entire function section, a path of a next auxiliary qubit that at least partially overlaps with the intersection may be iteratively searched for. In each iteration, a forward light-cone analysis may be performed from a start cycle of the path, and a backward light-cone analysis may be performed from an end cycle of the path. In some cases, the potential auxiliary qubit may or may not be verified prior to the iterative process.

In some exemplary embodiments, the iterative process may comprise iteratively performing Steps 210-240. For example, each potential auxiliary qubit in the intersection may be detected, verified, and extended according to Steps 210-230, and the extension may be analyzed, in accordance with Step 240. In some exemplary embodiments, the iterative process may search for a state retaining path for each qubit that is included in the intersection, or in an extension of the intersection. In some exemplary embodiments, in case no more qubits in the intersection remain not analyzed, one or more termination conditions may be met, and the iterative process may be terminated.

On Step 250, a function section may be detected in the representation. In some exemplary embodiments, the function section may be determined to comprise the intersection of the initial portion, as well as extensions determined by iteratively performing Steps 210-240. In some exemplary embodiments, the function section may include paths of auxiliary qubits that are detected on Step 210, along with intersections that are obtained on Step 230. For example, state retaining paths of potential auxiliary qubits in the intersection of Step 240, and their light-cone analysis, may be added to the function section. In some cases, state retaining paths may be added to the function section in case the respective potential auxiliary qubits are first verified, regardless of a verification thereof, or the like.

In some exemplary embodiments, the function section may be marked as a function section that represents a single functional block of a functional-level representation of the circuit. In some cases, between iterations, one or more post-processing operations may be performed in order to fine-tune the borders of the function section that was detected. In some exemplary embodiments, an indication of the function section may be outputted, e.g., to a screen. For example, the indication may comprise a visual indication, a textual indication, or the like, such as a visual marking of borders of one or more detected function sections in the representation.

In some exemplary embodiments, the method of FIG. 2 may be performed iteratively, for initial portions of the representation, until the entire representation is covered. For example, each iteration, a remaining portion of the representation may be analyzed to identify therein a state retaining path, a new initial portion may be selected to comprise the state retaining path, and a new function section may be identified based thereon according to Steps 210-250.

In some exemplary embodiments, an exemplary algorithm for detecting a function section, such in accordance with the method of FIG. 2, may be described as follows:
1. Detect a potential auxiliary qubit that is uncomputed.
   a. Detect a path of a qubit that starts and end with a same state.
   b. Optionally, validate the qubit.
      i. Validate individual qubits, quantum registers, or both.
2. Apply a backward light-cone from an end of the path, and a forward light-cone from a beginning of the path. Gates and qubits that are placed in the intersection between the light-cones, may be assumed to belong in a same function.
3. Find additional qubits (e.g., individual or quantum registers) in the intersection.
   a. Check if the additional qubits have a path that starts and end with the same state.
   b. Extend the intersection to include the path.
   c. Optionally, validate the additional qubits.
   d. Repeat Step 3 until closure (e.g., until no more additional qubits that were not analyzed are found).
4. Classify the intersection as a function section.

Referring now to FIGS. 3A-3D, showing an exemplary scenario, in accordance with some exemplary embodiments of the disclosed subject matter. For example, FIGS. 3A-3D may depict an exemplary scenario according to the method of FIG. 2.

Figure 3A:
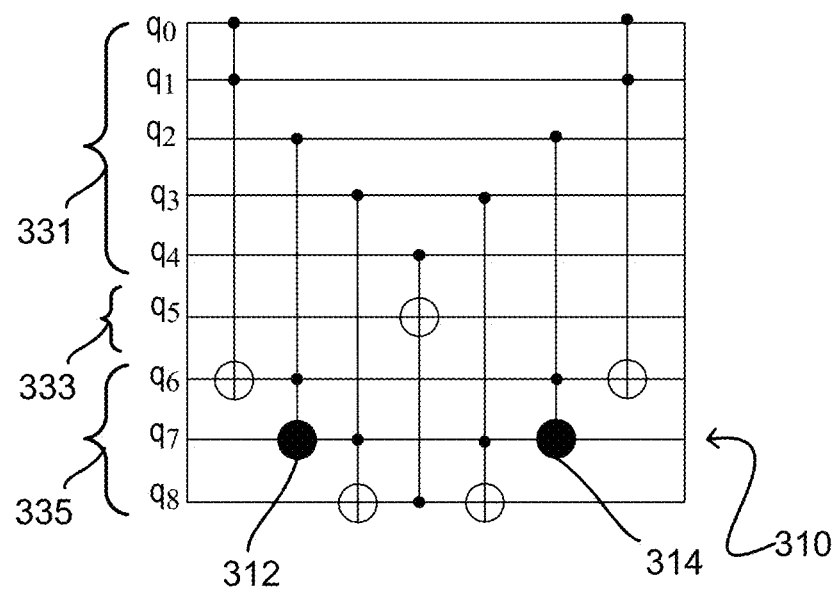
FIGS. 3A-3D illustrate an exemplary scenario, in accordance with some exemplary embodiments of the disclosed subject matter.

In some exemplary embodiments, FIG. 3A may depict a representation of a quantum circuit including qubits numbered 1-8 (depicted $q_0$-$q_8$), which may be classified to Control Qubit 331, Target Qubits 333, and Auxiliary Qubits 335. For example, Control Qubit 331 may comprise input qubits that are configured to provide data that is part of a quantum function logic flow. Target Qubits 333 may comprise output qubits that are configured to output a resulting state of the circuit, be manipulated with states of input qubits, or the like. Auxiliary Qubits 335 may comprise auxiliary qubits that have auxiliary properties. It is noted that the division of the qubits to categories may not be known or indicated to an agent (e.g., a software agent, a user, or the like) that is attempting to analyze the circuit and detect function sections therein.

In some exemplary embodiments, the representation may be analyzed based on inspected states of the qubits. For example, the states of $q_0$-$q_8$ in each cycle may have inspected states that are known or unknown, as they may be obtained from an inspection stage. As depicted in FIG. 3A, q 7 may be detected as being a potential Auxiliary Qubit 310 that complied with an auxiliary property. For example, Auxiliary Qubit 310 may be provided to a First Gate 312 at a first cycle with a first state, may be manipulated at subsequent intermediate cycles, and may be restored at a Second Gate 314 (e.g., performing an uncompute or inverse operation) to retain the same first state. In some exemplary embodiments, based on this analysis, Auxiliary Qubit 310 may be estimated to comprise an auxiliary qubit. In some cases, Auxiliary Qubit 310 may be verified as an auxiliary qubit, such as using one or more verification techniques. In some exemplary embodiments, the path of Auxiliary Qubit 310 from First Gate 312 to Second Gate 314 may be selected as an initial portion of the circuit, e.g., since the path may comprise a state retaining path.

Figure 3B:
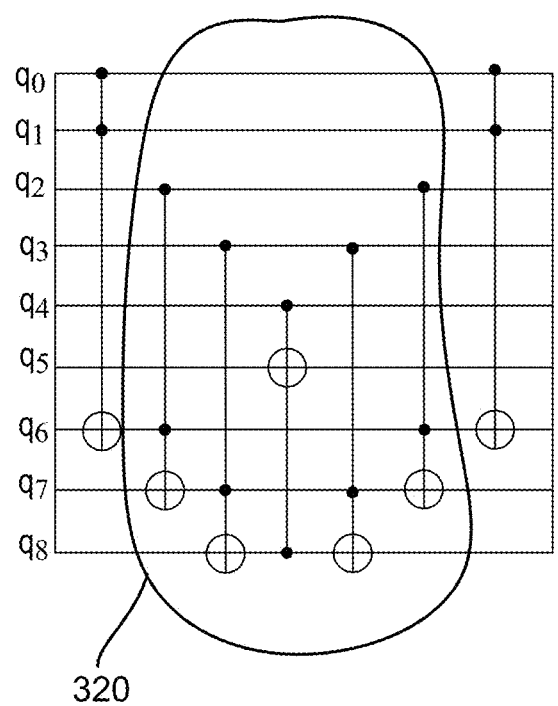

Referring now to FIG. 3B, after detecting the state retaining path of Auxiliary Qubit 310 between First Gate 312 and Second Gate 314, a light cone analysis may be performed around the borders of the state retaining path of Auxiliary Qubit 310. For example, any qubit and gate in Intersection 320 between the forward light-cones from First Gate 312 and between the backward light-cones from Second Gate 314 may be estimated to belong to the same function as Auxiliary Qubit 310, and may be added to a function section of Auxiliary Qubit 310. In some cases, Intersection 320 may be marked, borders thereof may be determined to belong to a same function section, or the like.

Figure 3C:
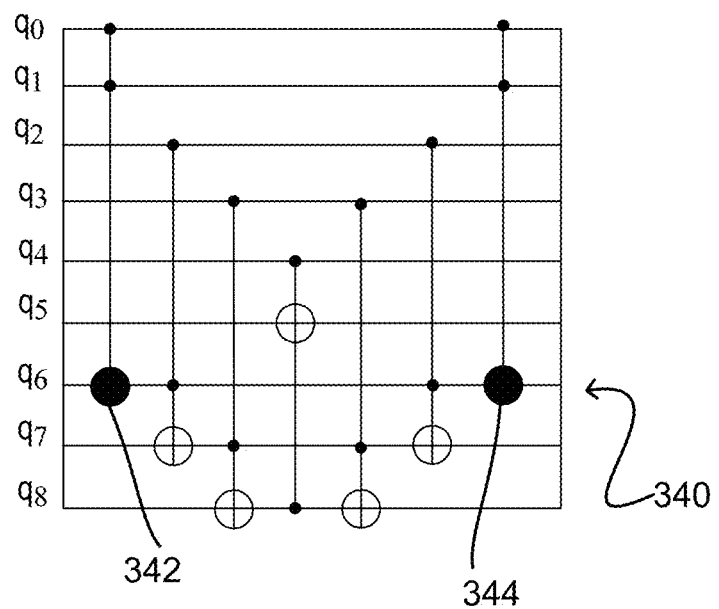

Referring now to FIG. 3C, Intersection 320 may be analyzed, and additional qubits may be detected therein. For example, Intersection 320 may comprise additional qubits $q_2$-$q_6$ and $q_8$. In some exemplary embodiments, the additional qubits may be analyzed to detect therein a qubit with a state retaining path that is associated with Intersection 320, e.g., crosses through Intersection 320, has one or more overlapping cycles with Intersection 320, or the like. For example, a state retaining path of $q_6$ may be detected between First Gate 342 and Second Gate 344, thus identifying $q_6$ as a potential Auxiliary Qubit 340 that complies with auxiliary properties.

Figure 3D:
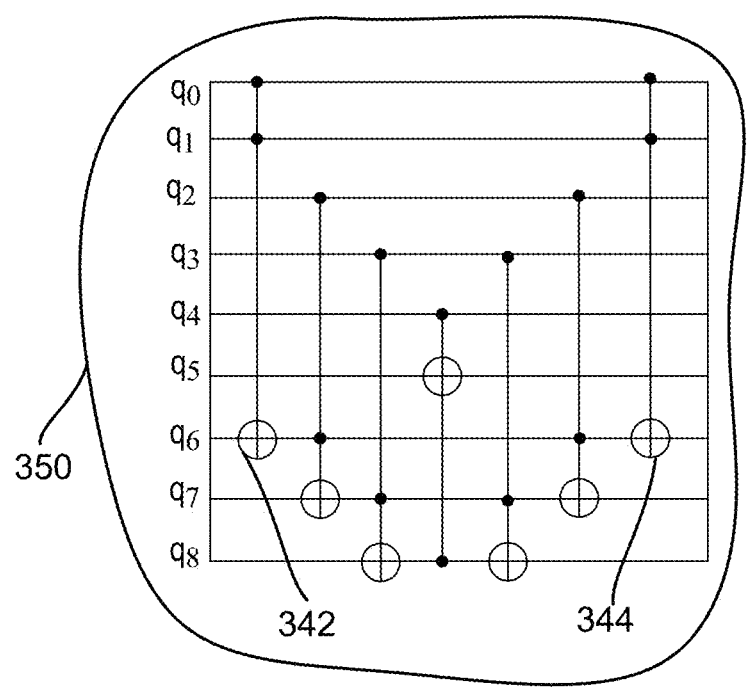

Referring now to FIG. 3D, Intersection 320 may be extended, to include the path of Auxiliary Qubit 340 between First Gate 342 and Second Gate 344, connected components thereof, or the like, thereby obtaining a modified intersection, e.g., Intersection 350. It is noted that the representation of the circuit may comprise additional portions that are not depicted, in addition to Intersection 350. For example, the representation may comprise a remaining portion (not depicted) that is divided into one or more function sections.

In some exemplary embodiments, the state retaining path of Auxiliary Qubit 340 between First Gate 342 and Second Gate 344 may be added to Intersection 320, thereby extending the function section. In some cases, a light cone analysis may be performed to the state retaining path of Auxiliary Qubit 340, and a resulting extension may be added to Intersection 320. For example, an intersection between a forward light-cone from First Gate 342 and between a backward light-cone from Second Gate 344 may be added to Intersection 350. In some cases, Intersection 350 may be obtained without performing a light-cone analysis, such as by adding the detected path of Auxiliary Qubit 340, connected components thereof, or the like. In some cases, Intersection 350 may be marked, borders thereof may be determined to belong to a same function section, or the like.

In some exemplary embodiments, each additional qubit that is included in the Intersection 320 or in any subsequent intersection, such as Intersection 350, may be analyzed, in order to detect any state retaining paths of the additional qubits that cross the existing intersection. In some exemplary embodiments, the function section may be extended, iteratively, until closure. In some exemplary embodiments, a closure may occur when no more additional qubits that were not already analyzed are detected in a current intersection. For example, a closure of Intersection 350 may occur upon determining that $q_2$-$q_5$ and $q_8$ do not have a state retaining path that crosses through Intersection 350. In other cases, a closure may occur based on any other termination conditions, such as upon determining that a current intersection is a local maximum, e.g., in accordance to the method of FIG. 4. In some cases, one or more post-processing schemes may or may not be performed after a closure is determined to occur, such as in order to fine-tune the borders of the function section.

Referring now to FIG. 4, showing an exemplary flowchart diagram of a method, in accordance with some exemplary embodiments of the disclosed subject matter.

On Step 410, a selection of an initial portion of the representation of the quantum circuit (e.g., corresponding to the representation of Step 110 of FIG. 1) may be obtained. For example, the selection may be performed randomly, based on heuristics, or the like. In some exemplary embodiments, the initial portion may comprise a connected component or section of the representation, such as a path of a qubit between adjacent cycles, that does not comprise detached components. In other cases, the initial portion may comprise one or more detached portions of the circuit. In some exemplary embodiments, the initial portion may not comprise the entire representation. For example, a first gate of the representation may be included in the initial portion, while a second gate of the representation may be excluded from the initial portion.

In some exemplary embodiments, the initial portion may be selected randomly, such as by selecting a random gate and attached components, selecting a random qubit between a random range of cycles, or the like. For example, the portion may be randomly selected to include qubit number i between cycles 6-12 and qubit number j between cycles 1-3.

In some exemplary embodiments, the initial component may be selected based on heuristics, such as by selecting a state retaining path of a qubit that retains a same state at a start and end of a range of cycles. In some exemplary embodiments, when a function ends, typically some of its qubits, both auxiliary qubits and non-auxiliary qubits, may return to their initial value, e.g., due to uncompute operations, in case they were not modified by the function, or the like. For example, before terminating, a function may release its auxiliary qubits in their original state, uncompute one or more qubits, release input qubits that were not manipulated, or the like. Accordingly, state retaining paths may be indicative of borders of a function section.

On Step 420, the initial portion may be scored, e.g., by an objective function. In some exemplary embodiments, an objective function may be defined to obtain an indication of a portion of a circuit, a representation thereof, or the like, and calculate therefore a score. In some exemplary embodiments, the score may represent or indicate the number of state retaining paths in the indicated portion of the circuit, including qubits that have a first state at a start of the path, and the same state at an end of the path. In some exemplary embodiments, the objective function may not differentiate between state retaining paths in which a qubit retains its state throughout the entire path, and between state retaining paths in which a qubit has a first state at a beginning of the path, is manipulated to a second state, and then is manipulated back to the first state at an end of the path. The objective function may utilize results from the inspection stage in order to identify state retaining paths in the portion of the circuit. For example, in case the initial portion comprises a path of a qubit from a first cycle to a second cycle, in which a state of the qubit at the first cycle is identical to a state of the qubit at the second cycle, the objective function may indicate that at least one state retaining path is included in the initial portion.

In some exemplary embodiments, the objective function may be configured to score better scores for more state retaining paths, and worse scores for less state retaining paths. For example, in case the objective function is configured to score one or more points for each state retaining path that is identified in the indication portion, a better score may include a greater or higher score, and vice versa. As another example, in case the objective function is configured to remove one or more points from an initial value for each state retaining path that is identified in the indication portion, a better score may include a lesser or lower score.

On Step 430, one or more calculations may be performed in order to detect a function section in the quantum circuit. In some exemplary embodiments, the function section may comprise a section of the representation that comprises at least part of the initial portion, potentially one or more extensions, and is a local maximum. In some exemplary embodiments, a local maximum section may comprise a section that obtains a best score from the objective function, compared to other alternatives that are associated to the same initial portion. In some exemplary embodiments, an iterative process may be performed to find the local maximum, by iteratively performing Steps 432-436 until closure.

On Step 432, a section of the representation, such as the initial portion, an extended section comprising at least a portion of the initial portion, or the like, may be adjusted, such as by extending the section with one or more cycles, connected components, or the like. For example, a light-cone analysis may be performed for detecting state retaining paths in the current section, such as by performing a forward light-cone from a last cycle of a state retaining path, performing a backward light-cone from a first cycle of the state retaining path, or the like. In some exemplary embodiments, the light-cone analysis may comprise a single iteration of a light-cone analysis, that does not add to the indicated portion more than one cycle. In some exemplary embodiments, extensions may only extend the initial portion, without removing cycles or components from the initial portion. In some exemplary embodiments, the current section may be extended by adding connected components that are connected to the set of elements in the current section. In other cases, any other methods may be used to extend the indicated portion.

On Step 434, edges between gates may be removed from the section that was adjusted On Step 432, in case they are estimated to belong to a different function. For example, in case a section includes a qubit with a first state at a first cycle a, that restores the first state at a second non-adjacent cycle b, and is then extended, by Step 432, to a third cycle c that also restores the first state of the qubit, the edge between cycles b and c may be removed. According to this example, the edge between cycles a and b may belong to a first function section that manipulated the qubit and restores its first state before releasing the qubit, while the edge between cycles b and c may belong to a second function section that also restores the state of the qubit. It may be desired to ensure that the section that is tested represents a single function, e.g., the first function, and not both first and second functions.

In some exemplary embodiments, redundant edges that connect a qubit to a gate of a different function may be removed. In case no such edges are detected, the current section may be retained without change. In some exemplary embodiments, a closure may be determined for an area in which an edge was removed, e.g., indicating that subsequent iterations should not extend the current section by adding the same edge again, or by connecting in any other manner to the gate of the different function.

On Step 436, the portion that is obtained from Step 434 may be scored, e.g., using the objective function.

In some exemplary embodiments, an optimization process of Step 430 may be configured to iteratively perform Steps 432-436, each time extending the initial portion or portion thereof with respect to one or more different state retaining paths, extensions thereof (e.g., using backward light-cone analysis, forward light-cone analysis, or a combination thereof), or the like, until all state retaining paths are processed. In some exemplary embodiments, redundant edges (if exist) may be removed at each iteration, in case the edges cross a border of a function section and connect a qubit to a gate of a different function section. In such cases, a border for extensions may be defined, indicating that any further extensions that are tested, scored, or the like, should not cross the border (e.g., should not connect an edge to the gate of the different function section). In some exemplary embodiments, each resulting section may be scored, and a best scoring section may be selected as a local maximum, and may be marked or determined to be a function section.

In some exemplary embodiments, the optimization process may utilize a local search in order to test all possible extensions to the initial portion or portion thereof (excluding extensions through edges that are removed by Step 434). In some exemplary embodiments, the local search may be configured to identify a highly-scored portion of the representation of the quantum circuit, such as by iteratively performing forward light-cones and backward light-cones from the initial portion, from extensions associated to the initial portion, or the like, and calculating a score thereto. In some exemplary embodiments, the local search may be based on an objective function that is configured to yield a score for an analyzed portion of the representation of the quantum circuit, starting with the initial portion. In some exemplary embodiments, the local search may be configured to select a resulting section that obtains a highest score from the objective function, and comprises at least a portion of the initial portion, thereby indicating that the section includes a highest number of state retaining paths, compared to alternative sections that are associated to a same function. For example, the score may be computed based on a number of qubits in the analyzed portion of the representation of the quantum circuit that have an identical value at an initial cycle and at an end cycle.

In some exemplary embodiments, the local search may not be a greedy function, at least since it may experiment with different extensions of the initial portion or extensions of portions of the initial portion, without necessarily stopping to experiment in case a section does not enhance a score of a previous section. For example, the local search may obtain an initial portion with a score of 2, may extend the initial portion, or portion thereof, to a first direction, resulting with a first section of score 2, and then extending the first section in the same direction, which may result with a second section of score 3. In some exemplary embodiments, the objective of the local search may be to find borders around the initial portion or portion thereof, that retain a maximal number of state retaining paths, indicating a maximal number of qubits that are uncomputed, are not manipulated by a function, or the like. In some exemplary embodiments, a section that is a local maximum, and is determined to be the highly-scored portion of the representation, may be determined to be a function section. In such cases, an indication of the function section may be outputted, e.g., to a screen. For example, the indication may comprise a visual indication, a textual indication, or the like, such as a visual marking of borders of one or more detected function sections in the representation.

Figure 5:
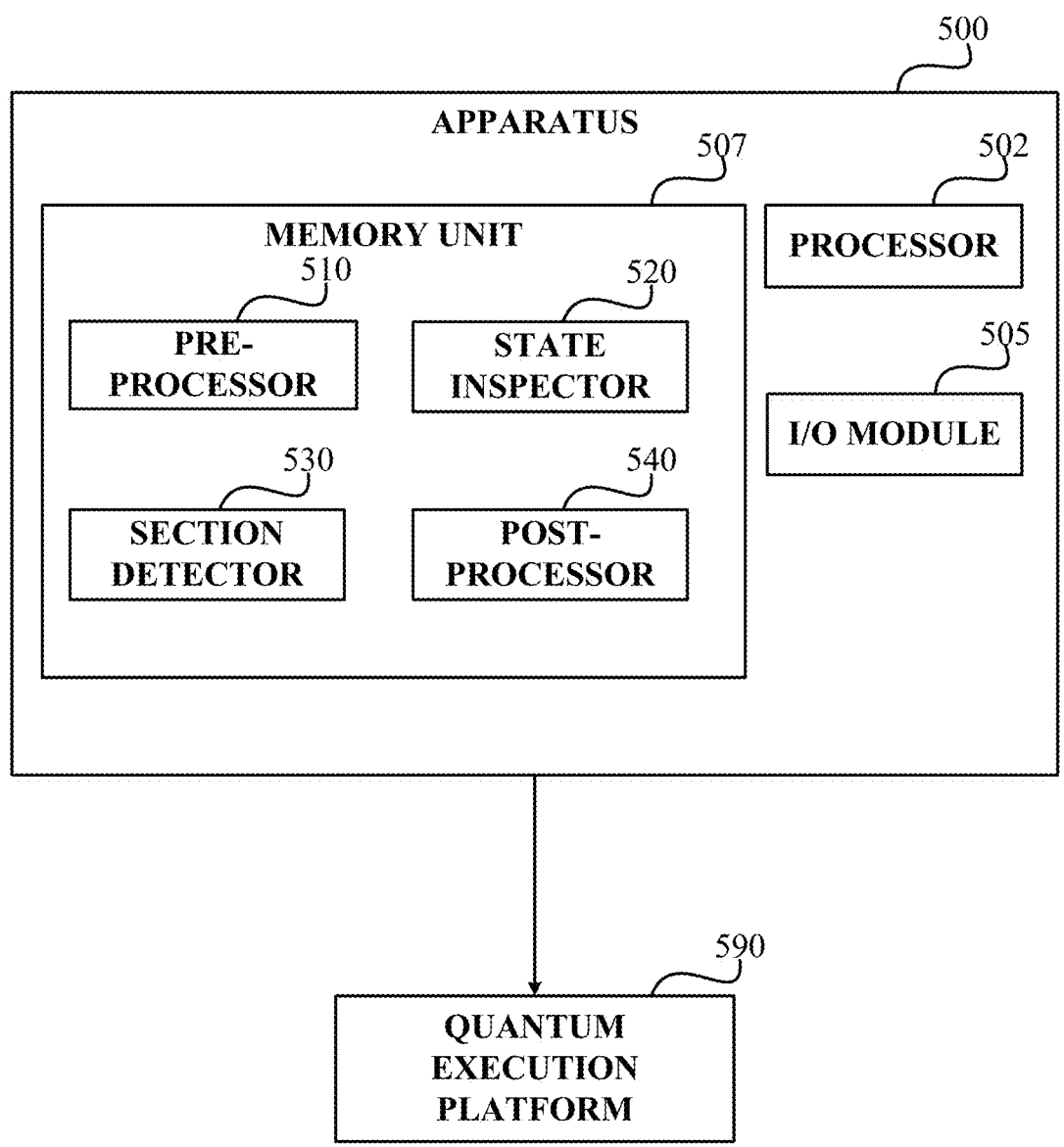
FIG. 5 illustrates an exemplary block diagram of an apparatus, in accordance with some exemplary embodiments of the disclosed subject matter.

Referring now to FIG. 5 showing an exemplary block diagram of an apparatus, in accordance with some exemplary embodiments of the disclosed subject matter.

In some exemplary embodiments, Apparatus 500 may comprise one or more Processor(s) 502. Processor 502 may be a Central Processing Unit (CPU), a microprocessor, an electronic circuit, an Integrated Circuit (IC) or the like. Processor 502 may be utilized to perform computations required by Apparatus 500 or any of its subcomponents. It is noted that Processor 502 may be a traditional classical processor, and not necessarily a quantum processor.

In some exemplary embodiments of the disclosed subject matter, Apparatus 500 may comprise an Input/Output (I/O) module 505. I/O Module 505 may be utilized to provide an output to and receive input from a user, an apparatus, or the like, such as, for example to obtain a representation of an unknown quantum program, communicating with quantum hardware, obtaining a quality measurer, or the like.

In some exemplary embodiments, Apparatus 500 may comprise Memory 507. Memory 507 may be a hard disk drive, a Flash disk, a Random Access Memory (RAM), a memory chip, or the like. In some exemplary embodiments, Memory 507 may retain program code operative to cause Processor 502 to perform acts associated with any of the subcomponents of Apparatus 500. Memory 507 may comprise one or more components as detailed below, implemented as executables, libraries, static libraries, functions, or any other executable components.

In some exemplary embodiments, Memory 507 may comprise a Pre-Processor 510. In some exemplary embodiments, Pre-Processor 510 may be configured to obtain a representation of an unknown quantum program, such as via I/O Module 505, and perform one or more pre-processing operations thereof. For example, Pre-Processor 510 may perform one or more operations that are described in Step 120 of FIG. 1, such as removing implementation-specific operations from the representation, replacing patterns of known gates with a representation of the respective gate, or the like.

In some exemplary embodiments, Memory 507 may comprise a State Inspector 520. In some exemplary embodiments, State Inspector 520 may be configured to obtain an adjusted representation from Pre-Processor 510, and inspect states of the qubits in each cycle of the adjusted representation, e.g., in accordance with Step 130 of FIG. 1. In some exemplary embodiments, State Inspector 520 may be configured to execute the quantum circuit onto Quantum Execution Platform 590, or any other execution platform, in order to inspect the qubit states. In some exemplary embodiments, State Inspector 520 may simulate an execution of the quantum circuit using an emulator, a simulator, or the like, on a classic computer, instead of actual execution by Quantum Execution Platform 590.

In some exemplary embodiments, Memory 507 may comprise a Section Detector 530. In some exemplary embodiments, Section Detector 530 may be configured to detect one or more function section in the adjusted representation, each function section of which is estimated to represent a functional block of a functional-level representation of the circuit. For example, Section Detector 530 may divide the representation in accordance to the steps of FIG. 2, FIG. 4, or the like.

In some exemplary embodiments, Memory 507 may comprise a Post-Processor 540. In some exemplary embodiments, Post-Processor 540 may be configured to fine-tune a function section that is detected by Section Detector 530, such as by adding one or more cycles thereto. For example, Post-Processor 540 may extend a function section in accordance with Step 150 of FIG. 1.

The present disclosed subject matter may be a system, a method, and/or a computer program product. The computer program product may include a computer readable storage medium (or media) having computer readable program instructions thereon for causing a processor to carry out aspects of the present disclosed subject matter.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), electrical signals transmitted through a wire, Quantum Random Access Memory (QRAM), photons, trapped ions, lasers, cold atoms, or the like.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosed subject matter may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server (or a group of multiple remote servers). In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosed subject matter.

Aspects of the present disclosed subject matter are described herein with reference to flowchart illustrations and/or block diagrams of methods, apparatus (systems), and computer program products according to embodiments of the disclosed subject matter. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosed subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosed subject matter has been presented for purposes of illustration and description but is not intended to be exhaustive or limited to the disclosed subject matter in the form disclosed. Many modifications and variations will be apparent to those of ordinary skill in the art without departing from the scope and spirit of the disclosed subject matter. The embodiment was chosen and described in order to best explain the principles of the disclosed subject matter and the practical application, and to enable others of ordinary skill in the art to understand the disclosed subject matter for various embodiments with various modifications as are suited to the particular use contemplated.

What is claimed is:

1. A method comprising:
    obtaining a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit;
    determining that the qubit is a candidate auxiliary qubit, wherein said determining comprises estimating that a state of the qubit at the first cycle is identical to a state of the qubit at the second cycle;
    identifying a function section in the quantum circuit based on the qubit, the function section commencing at a beginning cycle, the beginning cycle is ordered before the second cycle, the function section ending at an ending cycle, the ending cycle is ordered after the first cycle, the ending cycle is ordered after the commencing cycle, the function section utilizing the qubit as an auxiliary qubit; and
    outputting an indication of the function section.

2. The method of claim 1, wherein said identifying the function section comprises performing a forward light-cone analysis of the qubit from the first cycle and a backward light-cone analysis of the qubit from the second cycle, the function section comprising an intersection between the forward light-cone analysis and the backward light-cone analysis.

3. The method of claim 2, wherein said identifying the function section comprises:
    iteratively searching for a next candidate auxiliary qubit that is associated with the intersection, the next candidate auxiliary qubit is characterized in being estimated to have a same value at a third cycle and at a fourth cycle, the fourth cycle is ordered after the third cycle, wherein at least one cycle between the third and fourth cycles is included in the intersection; and
    performing a forward light-cone analysis of the next candidate auxiliary qubit from the third cycle and a backward light-cone analysis of the next candidate qubit from the fourth cycle, whereby identifying a second intersection, the function section comprising the second intersection.

4. The method of claim 1, wherein said identifying the function section comprises iteratively performing, starting with the qubit, a forward light-cone analysis of one or more qubits or gates included in the first cycle and a backward light-cone analysis of one or more qubits or gates included in the second cycle, until no additional qubits or gates are identified in an intersection of the forward light-cone analysis and the backward light-cone analysis, the function section comprising one or more qubits or gates identified in the intersection.

5. The method of claim 1, wherein said determining that the qubit is the candidate auxiliary qubit is based on a state inspection stage, the state inspection stage comprises inspecting states of one or more qubits of the plurality of qubits at each cycle of the plurality of cycles, wherein a qubit of the one or more qubits comprises an individual qubit or a quantum register.

6. The method of claim 1, further comprises verifying that the qubit is the auxiliary qubit using a testing circuit, the testing circuit is synthesized based on the quantum circuit and is configured to verify or refute that the qubit has an auxiliary property.

7. The method of claim 1, wherein the quantum circuit is an outcome of a preprocessing step, the preprocessing step configured to:
  detect in an initial quantum circuit one or more patterns of at least one of: a swap operation and an identity operation; and
  remove the one or more patterns from the initial quantum circuit.

8. The method of claim 1, wherein the quantum circuit is an outcome of a preprocessing step, the preprocessing step configured to:
  detect in an initial quantum circuit one or more patterns of gate-level implementations of one or more multi-qubit gates; and
  replace the one or more patterns of the gate-level implementations of the one or more multi-qubit gates with the one or more multi-qubit gates.

9. The method of claim 1, wherein the first and second cycles are not adjacent cycles, wherein at least one intermediate cycle separates the first and second cycles, wherein a state of the qubit at the at least one intermediate cycle is different from the state of the qubit at the first cycle.

10. The method of claim 1, wherein the quantum circuit is a circuit being reverse engineered without having access to a quantum program from which the quantum circuit was synthesized.

11. The method of claim 1, wherein said estimating comprising estimating that the state of the qubit at the first cycle is identical to the state of the qubit at the second cycle with a confidence score that is greater than a threshold.

12. The method of claim 1, wherein said outputting comprises:
  reconstructing a high-level representation of the quantum circuit or portion thereof, the high-level representation comprises a high-level functional block that is mapped to the function section;
  thereby enabling performing at least one action on the quantum circuit or portion thereof, the action chosen from a group of actions consisting of reverse engineering of the quantum circuit, performance analysis, and optimization of the quantum circuit.

13. A method comprising:
  obtaining a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit, the plurality of gates comprising a first gate and a second gate;
  obtaining an initial portion of the representation of the quantum circuit, the initial portion comprising the first gate, the initial portion excluding the second gate, the initial portion commencing at a first cycle and ending at a second cycle, the second cycle is ordered after the first cycle;
  utilizing a local search process to identify a highly-scored portion of the representation of the quantum circuit, the local search process is based on an objective function, the local search process starts from the initial portion, wherein the objective function is configured to yield a score for an analyzed portion of the representation of the quantum circuit, the score is computed based on a number of qubits in the analyzed portion of the representation of the quantum circuit that have an identical value at an initial cycle and at an end cycle, wherein the initial cycle and the end cycles of the qubits are included in the analyzed portion;
  identifying a function section in the quantum circuit based on the highly-scored portion of the representation of the quantum circuit; and
  outputting an indication of the function section.

14. The method of claim 13, wherein the local search process is configured to identify one or more extensions to at least a portion of the initial portion, wherein the extensions comprise one or more cycles or cycle portions that are added the portion of the initial portion, wherein a score of the portion of the initial portion together with the one or more extensions is a local optimum, the method further comprises determining that the highly-scored portion comprises the portion of the initial portion and the one or more extensions.

15. The method of claim 14, wherein the one or more extensions are determined by performing light-cone analyses to one or more state retaining paths associated with the initial portion.

16. The method of claim 13, wherein the selection of the initial portion is performed randomly.

17. The method of claim 13, wherein the selection of the initial portion is based on a determination that the state of the qubit at the first cycle is identical to the state of the qubit at the second cycle.

18. The method of claim 17, further comprises performing a state inspection stage, the state inspection stage comprising inspecting a state of each of the plurality of qubits at each cycle of the plurality of cycles, wherein the state of the qubit at the first cycle is determined to be identical to the state of the qubit at the second cycle based on the state inspection stage.

19. The method of claim 13, wherein the quantum circuit is an outcome of a preprocessing step, the preprocessing step configured to:
  detect in an initial quantum circuit one or more patterns of at least one of: a swap operation and an identity operation; and
  remove the one or more patterns from the initial quantum circuit.

20. The method of claim 13, wherein the quantum circuit is an outcome of a preprocessing step, the preprocessing step configured to:
  detect in an initial quantum circuit one or more patterns of gate-level implementations of one or more multi-qubit gates; and
  replace the one or more patterns of gate-level implementations of one or more multi-qubit gates with the one or more multi-qubit gates.

21. The method of claim 13, wherein the quantum circuit is a circuit being reverse engineered without having access to a quantum program from which the quantum circuit was synthesized.

22. An apparatus comprising a processor and coupled memory, said processor being adapted to:

obtain a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit;

determine that the qubit is a candidate auxiliary qubit, wherein said determining comprises estimating that a state of the qubit at the first cycle is identical to a state of the qubit at the second cycle;

identify a function section in the quantum circuit based on the qubit, the function section commencing at a beginning cycle, the beginning cycle is ordered before the second cycle, the function section ending at an ending cycle, the ending cycle is ordered after the first cycle, the ending cycle is ordered after the commencing cycle, the function section utilizing the qubit as an auxiliary qubit; and output an indication of the function section.

23. The apparatus of claim 22, wherein said identify the function section comprises performing a forward light-cone analysis of the qubit from the first cycle and a backward light-cone analysis of the qubit from the second cycle, the function section comprising an intersection between the forward light-cone analysis and the backward light-cone analysis.

24. The apparatus of claim 22, wherein said identify the function section comprises:

iteratively searching for a next candidate auxiliary qubit that is associated with the intersection, the next candidate auxiliary qubit is characterized in being estimated to have a same value at a third cycle and at a fourth cycle, the fourth cycle is ordered after the third cycle, wherein at least one cycle between the third and fourth cycles is included in the intersection; and performing a forward light-cone analysis of the next candidate auxiliary qubit from the third cycle and a backward light-cone analysis of the next candidate qubit from the fourth cycle, whereby identifying a second intersection, the function section comprising the second intersection.

25. A computer program product comprising a non-transitory computer readable medium retaining program instructions, which program instructions when read by a processor, cause the processor to:

obtain a representation of a quantum circuit, the quantum circuit is configured to manipulate a plurality of qubits over a plurality of cycles using a plurality of gates, the plurality of cycles comprising a first cycle and a second cycle, the second cycle is ordered after the first cycle, the plurality of qubits comprising a qubit, the plurality of gates comprising a first gate and a second gate;

obtain an initial portion of the representation of the quantum circuit, the initial portion comprising the first gate, the initial portion excluding the second gate, the initial portion commencing at a first cycle and ending at a second cycle, the second cycle is ordered after the first cycle;

utilize a local search process to identify a highly-scored portion of the representation of the quantum circuit, the local search process is based on an objective function, the local search process starts from the initial portion, wherein the objective function is configured to yield a score for an analyzed portion of the representation of the quantum circuit, the score is computed based on a number of qubits in the analyzed portion of the representation of the quantum circuit that have an identical value at an initial cycle and at an end cycle, wherein the initial cycle and the end cycles of the qubits are included in the analyzed portion;

identify a function section in the quantum circuit based on the highly-scored portion of the representation of the quantum circuit; and output an indication of the function section.

26. The computer program product of claim 25, wherein the local search process is configured to identify one or more extensions to at least a portion of the initial portion, wherein the extensions comprise one or more cycles or cycle portions that are added the portion of the initial portion, wherein a score of the portion of the initial portion together with the one or more extensions is a local optimum, the program instructions, when read by the processor, cause the processor to determine that the highly-scored portion comprises the portion of the initial portion and the one or more extensions.

* * * * *